(12) United States Patent
Tanimura

(10) Patent No.: US 10,699,906 B2
(45) Date of Patent: Jun. 30, 2020

(54) HEAT TREATMENT METHOD FOR P-TYPE SEMICONDUCTOR

(71) Applicant: SCREEN HOLDINGS CO., LTD., Kyoto (JP)

(72) Inventor: Hideaki Tanimura, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 0 days.

(21) Appl. No.: 15/653,929

(22) Filed: Jul. 19, 2017

(65) Prior Publication Data

US 2018/0033628 A1 Feb. 1, 2018

(30) Foreign Application Priority Data

Jul. 26, 2016 (JP) .................................. 2016-146179

(51) Int. Cl.
*H01L 21/263* (2006.01)
*H01L 21/268* (2006.01)
*H01L 21/67* (2006.01)
*H01L 21/687* (2006.01)
(Continued)

(52) U.S. Cl.
CPC ...... *H01L 21/2636* (2013.01); *H01L 21/0231* (2013.01); *H01L 21/02381* (2013.01);
(Continued)

(58) Field of Classification Search
CPC . H01L 21/268; H01L 21/2636; H01L 21/324; H01L 21/02381; H01L 21/102686; H01L 21/02686; H01L 2924/10252
See application file for complete search history.

(56) References Cited

U.S. PATENT DOCUMENTS

2005/0062107 A1  3/2005 Ito et al.
2006/0228897 A1  10/2006 Timans
(Continued)

FOREIGN PATENT DOCUMENTS

JP  2015-115415 A   6/2015
TW    200518230 A   6/2005
(Continued)

OTHER PUBLICATIONS

Taiwanese Office Action issued in corresponding Taiwanese Patent Application No. 106118820, dated Jun. 28, 2018, with English Translation of the Japanese Translation of the Taiwanese Office Action.

*Primary Examiner* — Zandra V Smith
*Assistant Examiner* — Abbigale A Boyle
(74) *Attorney, Agent, or Firm* — McDermott Will & Emery LLP

(57) ABSTRACT

A germanium semiconductor layer doped with a dopant such as boron becomes a p-type semiconductor. The semiconductor layer is preheated at a preheating temperature ranging from 200° C. to 300° C., and then heated at a treatment temperature ranging from 500° C. to 900° C., by extremely short-time irradiation of flash light. While oxygen is unavoidably mixed in germanium and becomes a thermal donor at 300° C. to 500° C., the semiconductor layer stays in a temperature range of 300° C. to 500° C. for a negligibly short period of time due to an extremely short irradiation time of 0.1 milliseconds to 100 milliseconds by the flash light. Therefore, the thermal donor can be prevented from being generated in the germanium semiconductor layer.

1 Claim, 10 Drawing Sheets

(51) Int. Cl.
*H01L 21/324* (2006.01)
*H01L 21/02* (2006.01)
*H01L 33/34* (2010.01)
*H01L 21/265* (2006.01)

(52) U.S. Cl.
CPC ...... H01L 21/02686 (2013.01); H01L 21/268 (2013.01); H01L 21/2686 (2013.01); H01L 21/324 (2013.01); H01L 21/67115 (2013.01); H01L 21/6875 (2013.01); H01L 21/68707 (2013.01); H01L 33/343 (2013.01); *H01L 21/26513* (2013.01)

(56) References Cited

U.S. PATENT DOCUMENTS

| | | |
|---|---|---|
| 2010/0075499 A1 | 3/2010 | Olsen |
| 2010/0099268 A1 | 4/2010 | Timans |
| 2012/0208377 A1 | 8/2012 | Timans |
| 2012/0244725 A1* | 9/2012 | Fuse ................. H01L 21/26513 438/799 |
| 2013/0078786 A1 | 3/2013 | Fuse et al. |
| 2015/0270342 A1 | 9/2015 | Tsai et al. |
| 2016/0197076 A1 | 7/2016 | Kamata |
| 2016/0204229 A1 | 7/2016 | Tsai et al. |
| 2018/0006117 A1 | 1/2018 | Tsai et al. |

FOREIGN PATENT DOCUMENTS

| | | |
|---|---|---|
| TW | 200735164 A | 9/2007 |
| TW | 201023268 A | 6/2010 |
| TW | 201320191 A | 5/2013 |
| TW | 201537745 A | 10/2015 |

* cited by examiner

F I G. 5
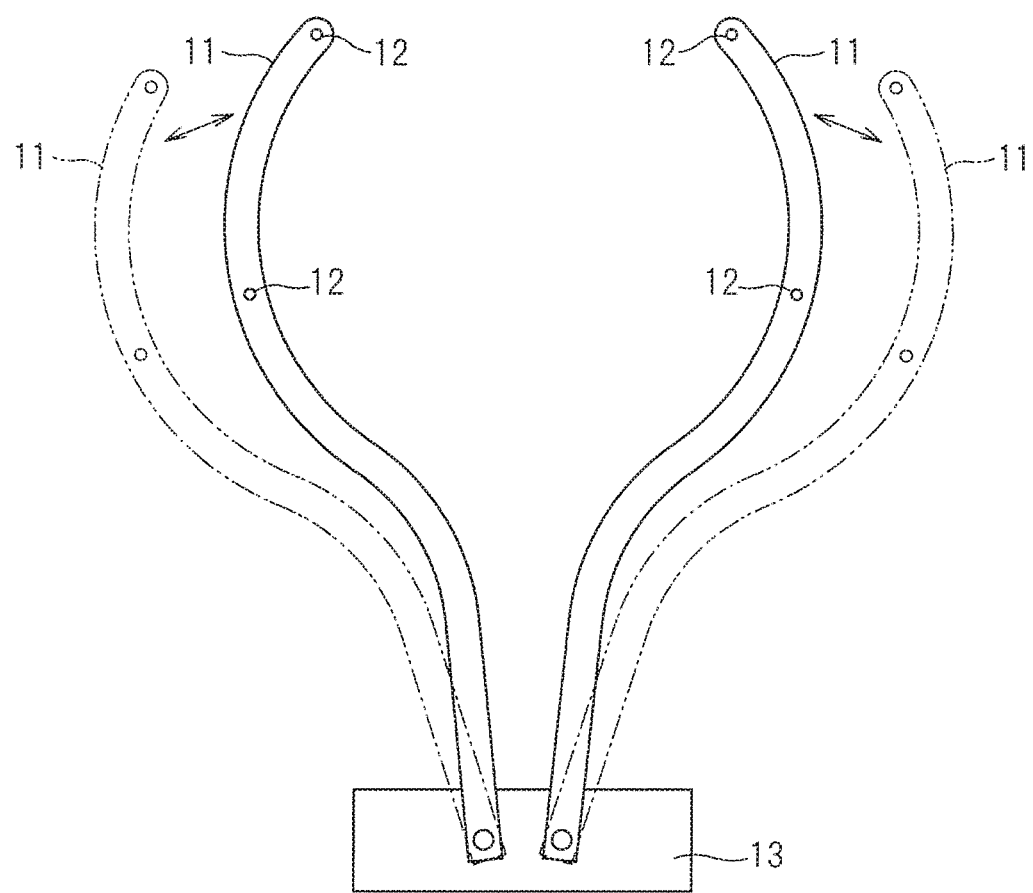

F I G. 7
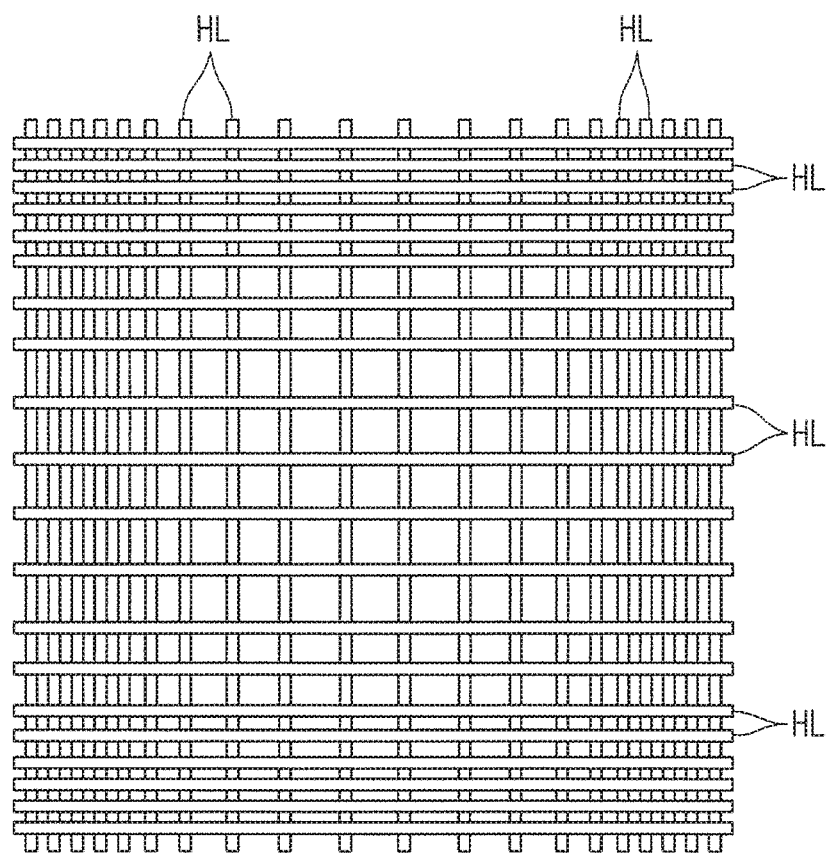

F I G . 1 0
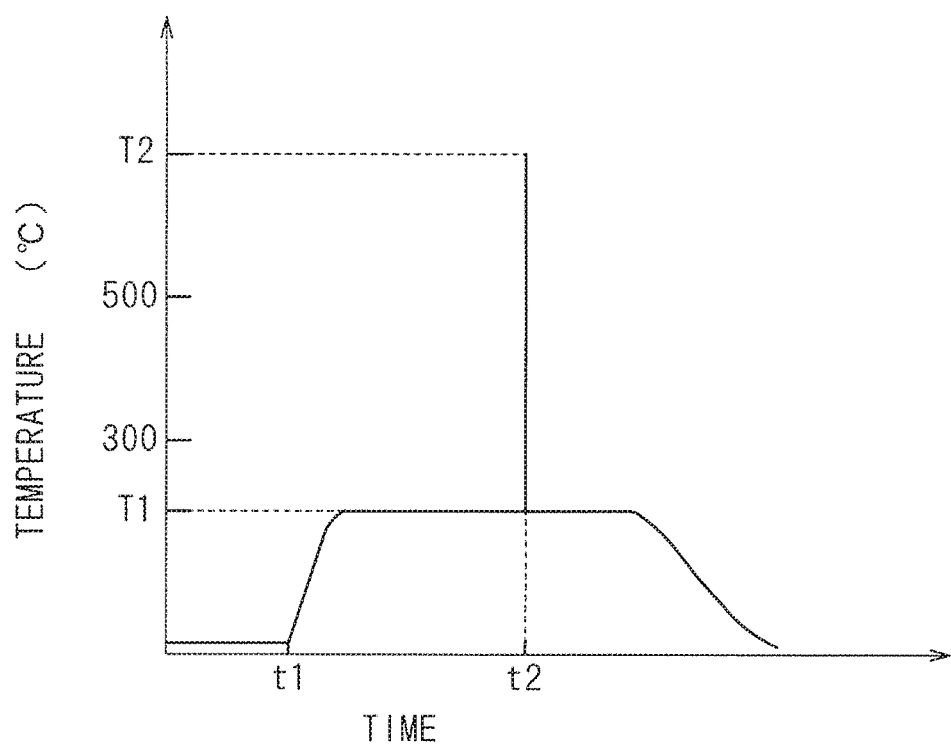

HEAT TREATMENT METHOD FOR P-TYPE SEMICONDUCTOR

RELATED APPLICATIONS

This application claims the benefit of Japanese Application No. 2016-146179, filed on Jul. 26, 2016, the disclosure of which is incorporated by reference herein.

BACKGROUND OF THE INVENTION

Field of the Invention

The present invention relates to a heat treatment method for a p-type semiconductor containing germanium as a major component.

Description of the Background Art

As material of a semiconductor device, silicon (Si) is mainly used, but germanium (Ge) is also used in some cases. Since germanium is high in mobility compared with silicon, it has been proposed to be used as channel material of a field effect transistor (FET) (refer to US2016/0197076, for example).

A single crystal of germanium which is used for a semiconductor is typically manufactured by Czochralski method (Cz method). According to the Czochralski method, oxygen (O) is mixed in molten high-purity germanium in a quartz crucible. Thus, the mixed oxygen is combined with two germanium atoms in the single-crystal germanium and exists in the interstitial site. In addition, oxygen is unavoidably mixed in germanium as well by another manufacturing method.

When the single-crystal germanium is heated to 300° C. to 500° C., the mixed oxygen additionally emits one electron and is combined with three germanium atoms. That is, the oxygen serves as a donor. Here, the oxygen which emits the free electron in the heat treatment is called a thermal donor. The thermal donor does not cause a big problem in a case of n-type semiconductor, but in a case of p-type semiconductor, it causes the problem that a hole serving as a carrier recombined with the free electron emitted from the thermal donor, and the hole disappears.

SUMMARY OF THE INVENTION

The present invention is directed to a heat treatment method for a p-type semiconductor containing germanium as its major component.

According to one aspect of the present invention, a heat treatment method for a p-type semiconductor includes the steps of: (a) preheating a dopant-doped germanium semiconductor layer at a preheating temperature ranging from 200° C. to 300° C.; and (b) heating the semiconductor layer at a treatment temperature ranging from 500° C. to 900° C. by irradiation with a flash light from a flash lamp.

The semiconductor layer stays in a temperature range of 300° C. to 500° C. for a negligibly short period of time, so that the thermal donor can be prevented from being generated in the germanium semiconductor layer.

Thus, it is an object of the present invention to prevent the thermal donor from being generated.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a plan view of a transfer mechanism;

FIG. 7 is a plan view illustrating a layout of a plurality of halogen lamps;

FIG. 10 is a view illustrating a temperature change of a semiconductor layer formed on a surface of the substrate.

DESCRIPTION OF THE PREFERRED EMBODIMENT

Hereinafter, the preferred embodiment of the present invention will be described in detail with reference to the drawings.

Figure 1:
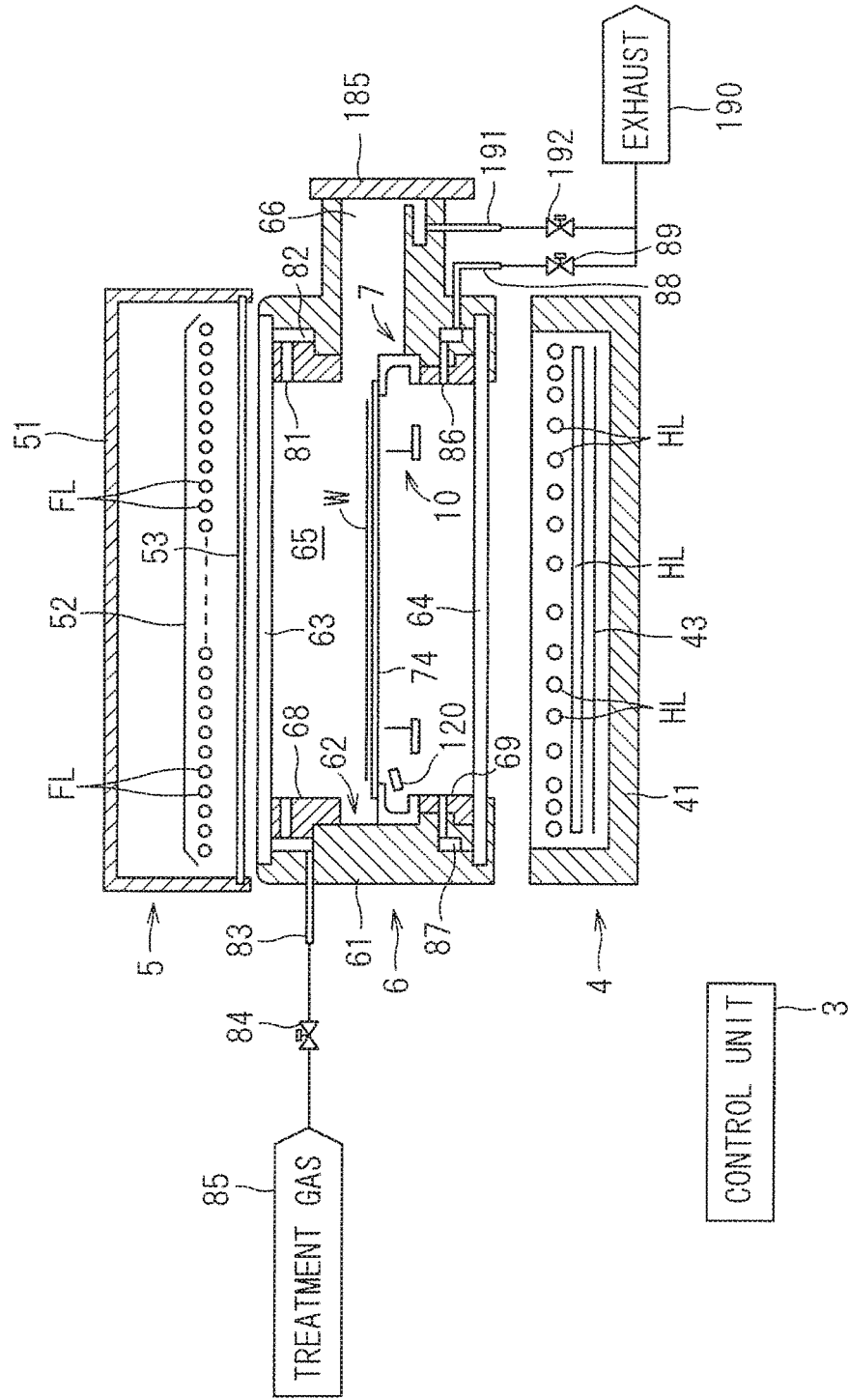
FIG. 1 is a vertical cross-sectional view illustrating a configuration of a heat treatment apparatus to be used in a heat treatment method in the present invention.

First, a heat treatment apparatus to implement a heat treatment method according to the preset invention will be described. FIG. 1 is a vertical cross-sectional view illustrating a configuration of a heat treatment apparatus 1 to be used in the heat treatment method according to the present invention. The heat treatment apparatus 1 in FIG. 1 is a flash lamp annealer for heating a disk-shaped substrate W by irradiating the substrate W with flash light. A diameter size of the substrate W to be treated is not limited in particular, and it is 300 mm or 450 mm, for example. Furthermore, in FIGS. 1 to 10, a dimension of a component and the number of the components are exaggerated or simplified as needed to be easily understood.

The heat treatment apparatus 1 includes a chamber 6 for accommodating the substrate W, a flash heating unit 5 incorporating a plurality of flash lamps FL, a halogen heating unit 4 incorporating a plurality of halogen lamps HL. The flash heating unit 5 is provided above the chamber 6, and the halogen heating unit 4 is provided below the chamber 6. Furthermore, in the chamber 6, the heat treatment apparatus 1 includes a retention unit 7 for horizontally retaining the substrate W, and a transfer mechanism 10 for transferring the substrate W between the retention unit 7 and an outside of the apparatus. Furthermore, the heat treatment apparatus 1 includes a control unit 3 for controlling each of operation mechanisms provided in the halogen heating unit 4, the flash heating unit 5, and the chamber 6 to perform the heat treatment for the substrate W.

The chamber 6 is formed by attaching chamber windows made of quartz on an upper and a lower sides of a cylindrical chamber lateral part 61. The chamber lateral part 61 has a roughly tubular shape with the open top and bottom. An upper chamber window 63 is attached to close the upper opening and a lower chamber window 64 is attached to close the lower opening. The upper chamber window 63 is a disk-shaped member made of quartz serving as a ceiling portion of the chamber 6 and functions as the quartz window which transmits the flash light emitted from the flash heating unit 5 to the chamber 6. Furthermore, the lower chamber window 64 is also a disk-shaped member made of quartz serving as a floor portion f the chamber 6 and functions as the quartz window which transmits a light from the halogen heating unit 4 to the chamber 6.

Furthermore, a reflection ring 68 and a reflection ring 69 are attached to an upper and a lower portions of an inner wall surface of the chamber lateral part 61, respectively. Both of the reflection rings 68 and 69 are formed into annular shapes. The upper reflection ring 68 is attached by engagement from an upper side of the chamber lateral part 61. Meanwhile, the lower reflection ring 69 is attached by engagement from a lower side of the chamber lateral part 61 and fixed by a screw (not shown). Thus, both of the reflection rings 68 and 69 are detachably attached to the chamber lateral part 61. The inner space of the chamber 6, that is, the space surrounded by the upper chamber window 63, the lower chamber window 64, the chamber lateral part 61, and the reflection rings 68 and 69 is defined as a heat treatment space 65.

When the reflection rings 68 and 69 are attached to the chamber lateral part 61, a recessed part 62 is formed on the inner wall surface of the chamber 6. That is, the recessed part 62 is formed so as to be surrounded by a center portion to which the reflection rings 68 and 69 are not attached on the inner wall surface of the chamber lateral part 61, a lower end surface of the reflection ring 68 and an upper end surface of the reflection ring 69. The recessed part 62 is annularly formed on the inner wall surface of the chamber 6 along a horizontal direction and surrounds the retention unit 7 for retaining the substrate W. The chamber lateral part 61 and the reflection rings 68 and 69 are formed of metal material (such as stainless steel) which is superior in strength and heat resistance.

Furthermore, a conveyance opening (furnace opening) 66 is formed in the chamber lateral part 61 to carry the substrate W into or from the chamber 6. The conveyance opening 66 can be opened and closed with a gate valve 185. The conveyance opening 66 is communicated with and connected to an outer peripheral surface of the recessed part 62. Therefore, while the gate valve 185 is set to open the conveyance opening 66, the substrate W can be carried into the heat treatment space 65 from the conveyance opening 66 through the recessed part 62, and the substrate W can be carried out from the heat treatment space 65. Furthermore, when the conveyance opening 66 is closed with the gate valve 185, the heat treatment space 65 in the chamber 6 becomes a sealed space.

In addition, a gas supply hole 81 is formed in an upper portion of the inner wall of the chamber 6 to supply a treatment gas into the heat treatment space 65. The gas supply hole 81 is provided above the recessed part 62 and may be formed in the reflection ring 68. The gas supply hole 81 is communicated with and connected to a gas supplying pipe 83 through a buffer space 82 which is annularly formed in a sidewall of the chamber 6. The gas supplying pipe 83 is connected to a treatment-gas supply source 85. Furthermore, a valve 84 is inserted to an intermediate part of a path of the gas supplying pipe 83. When the valve 84 is opened, a treatment gas is supplied from the treatment-gas supply source 85 to the buffer space 82. The treatment gas supplied into the buffer space 82 flows and spreads in the buffer space 82 having fluid resistance smaller than that of the gas supply hole 81 and is supplied to the heat treatment space 65 through the gas supply hole 81. As the treatment gas, an inert gas such as nitrogen ($N_2$), or a reactive gas such as hydrogen ($H_2$) or ammonia ($NH_3$) may be used (nitrogen in this preferred embodiment).

Meanwhile, a gas exhaust hole 86 is provided in a lower portion of the inner wall of the chamber 6 to exhaust the gas in the heat treatment space 65. The gas exhaust hole 86 is provided below the recessed part 62 and may be provided in the reflection ring 69. The gas exhaust hole 86 is communicated with and connected to a gas exhaust pipe 88 through a buffer space 87 which is annularly feinted in the sidewall of the chamber 6. The gas exhaust pipe 88 is connected to an exhaust unit 190. Furthermore, a valve 89 is inserted in an intermediate part of the path of the gas exhaust pipe 88. When the valve 89 is opened, the gas in the heat treatment space 65 is exhausted from the gas exhaust hole 86 to the gas exhaust pipe 88 through the buffer space 87. Here, a plurality of gas supply holes 81 and a plurality of gas exhaust holes 86 may be provided along a circumferential direction of the chamber 6, or they may have a slit shape. Furthermore, the treatment-gas supply source 85 and the exhaust unit 190 may be mechanisms provided in the heat treatment apparatus 1 or may be utilities in a factory where the heat treatment apparatus 1 is installed.

Furthermore, a gas exhaust pipe 191 is connected to an end of the conveyance opening 66 to exhaust the gas in the heat treatment space 65. The gas exhaust pipe 191 is connected to the exhaust unit 190 through a valve 192. When the valve 192 is opened, the gas in the chamber 6 is exhausted through the conveyance opening 66.

Figure 2:
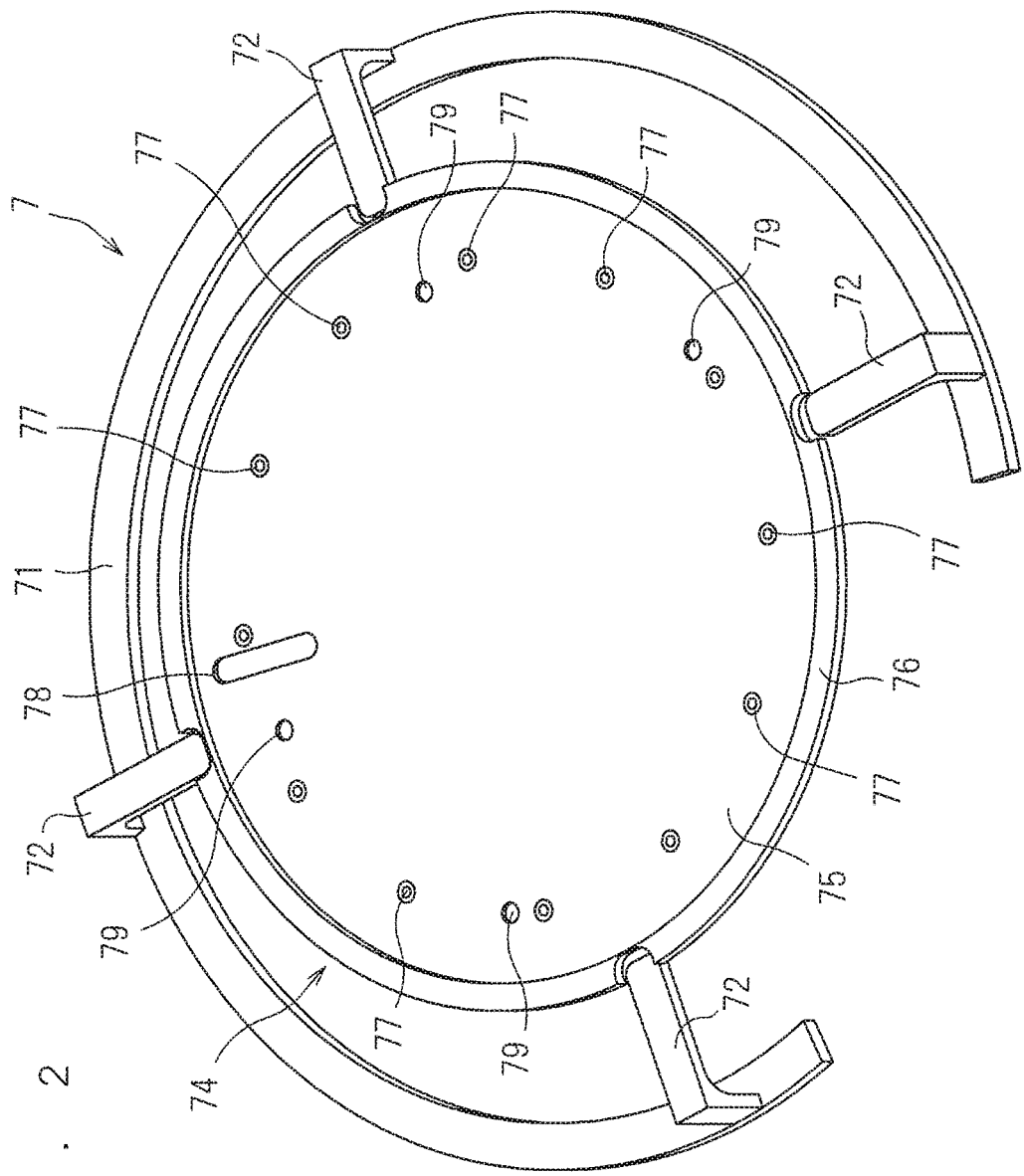
FIG. 2 is a perspective view illustrating an overall appearance of a retention unit.

FIG. 2 is a perspective view illustrating an overall appearance of the retention unit 7. The retention unit 7 includes a base ring 71, coupling parts 72, and a susceptor 74. Each of the base ring 71, the coupling parts 72, and the susceptor 74 is formed of quartz. That is, the entire retention unit 7 is formed of quartz.

The base ring 71 is an arc-shaped quartz member in which one portion is missing from an annular shape. This missing portion is provided to prevent interference between later-described transfer arms 11 of the transfer mechanism 10 and the base ring 71. The base ring 71 is placed on a bottom surface of the recessed part 62 and is supported by the wall surface of the chamber 6 (refer to FIG. 1). A plurality of coupling parts 72 (four in this preferred embodiment) are provided to rise from the upper surface of the base ring 71 along the circumferential direction of the annular shape of the base ring 71. The coupling part 72 is also made of quartz and fixed to the base ring 71 by welding.

Figure 3:
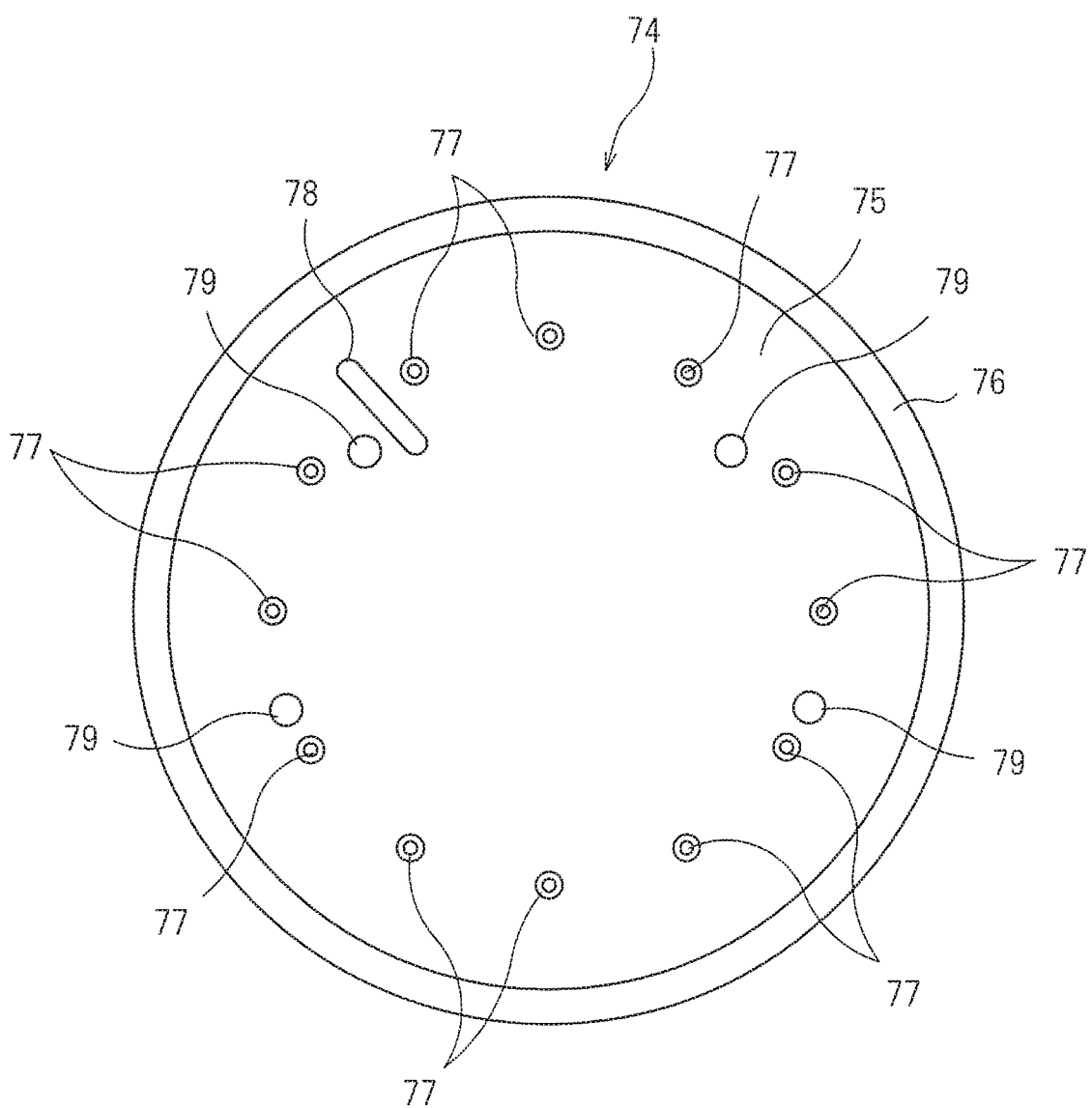
FIG. 3 is a plan view of a scepter.
Figure 4:
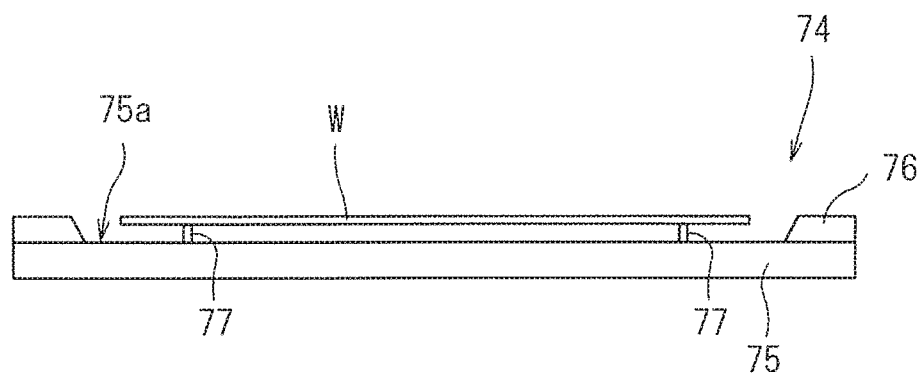
FIG. 4 is a cross-sectional view of the scepter.

The susceptor 74 is supported by the four coupling parts 72 provided on the base ring 71. FIG. 3 is a plan view of the susceptor 74. FIG. 4 is a cross-sectional view of the susceptor 74. The susceptor 74 includes a retention plate 75, a guide ring 76, and a plurality of substrate support pins 77. The retention plate 75 is a roughly circular plate-shaped member formed of quartz. The diameter of the retention plate 75 is larger than a diameter of the substrate W. That is, the retention plate 75 has a planar size larger than the substrate W.

The guide ring 76 is placed on an upper-surface peripheral portion of the retention plate 75. The guide ring 76 is an annular member having an inner diameter larger than the diameter of the substrate W. For example, when the diameter of the substrate W is 300 mm, the inner diameter of the guide ring 76 is 320 mm. An inner circumference of the guide ring 76 is formed into a tapered surface which is enlarged upward from the retention plate 75. The guide ring 76 is formed of quartz similarly to the retention plate 75. The guide ring 76 may be welded to the upper surface of the retention plate 75, or may be fixed to the retention plate 75 with a pin separately processed. Alternatively, the retention plate 75 and the guide ring 76 may be processed as one integrated member.

The region of the upper surface of the retention plate 75 that is in the inside of the guide ring 76 serves as a planar retention surface 75a, which retains the substrate W. The plurality of substrate support pins 77 are provided to rise from the retention surface 75a of the retention plate 75. In this preferred embodiment, in total, twelve substrate support pins 77 are provided to rise from the retention surface 75a at every 30 degrees along the circumference of a concentric circle of the outer circumference circle of the retention surface 75a (inner circumferential circle of the guide ring 76). The diameter of the circle on which the twelve substrate support pins 77 are disposed (a distance between the opposite substrate support pins 77) is smaller than the diameter of the substrate W, and when the diameter of the substrate W is 300 mm, it ranges from 270 mm to 280 mm (280 mm in this preferred embodiment). Each of the substrate support pins 77 is formed of quartz. The plurality of substrate support pins 77 may be provided to the upper surface of the retention plate 75 by welding or may be integrally processed with the retention plate 75.

Referring to FIG. 2 again, the four coupling parts 72 provided to rise from the base ring 71 are fixed to the periphery of the retention plate 75 of the susceptor 74 by welding. That is, the susceptor 74 and the base ring 71 are fixedly coupled with the coupling parts 72. The retention unit 7 is attached to the chamber 6 with base ring 71 of the retention unit 7 supported by the wall surface of the chamber 6. When the retention unit 7 is attached to the chamber 6, the retention plate 75 of the susceptor 74 is kept in a horizontal state (in which its normal line coincides with a vertical direction). That is, the retention surface 75a of the retention plate 75 is a horizontal surface.

The substrate W carried in the chamber 6 is placed and retained in the horizontal state on the susceptor 74 of the retention unit 7 attached to the chamber 6. At this point, the substrate W is retained by the susceptor 74 by being supported by the twelve substrate support pins 77, which are provided to rise from the retention plate 75. More precisely, upper ends of the twelve substrate support pins 77 are in contact with a lower surface of the substrate W to support the substrate W. Since a height of the twelve substrate support pins 77 (a distance from the upper end of the substrate support pin 77 to the retention surface 75a of the retention plate 75) is uniform, the substrate W can be supported by the twelve substrate support pins 77 in the horizontal state.

Thus, the substrate W is supported by the plurality of substrate support pins 77 at a predetermined distance from the retention surface 75a of the retention plate 75. Here, a thickness of the guide ring 76 is larger than the height of the substrate support pin 77. Therefore, horizontal direction misalignment of the substrate W which is supported by the plurality of substrate support pins 77 is prevented by the guide ring 76.

Furthermore, as illustrated in FIGS. 2 and 3, a vertically penetrating opening 78 is formed in the retention plate 75 of the susceptor 74. The opening 78 is provided so that a radiation thermometer 120 (refer to FIG. 1) can receive a radiated light (infrared light) emitted from the lower surface of the substrate W retained by the susceptor 74. That is, the radiation thermometer 120 receives the light emitted from the lower surface of the substrate W retained by the susceptor 74 through the opening 78, and a temperature of the substrate W is measured by a detector separately provided. Furthermore, four through-holes 79 are formed in the retention plate 75 of the susceptor 74 so that lift pins 12 of the transfer mechanism 10 which will be described below penetrate them to transfer the substrate W.

Figure 6:
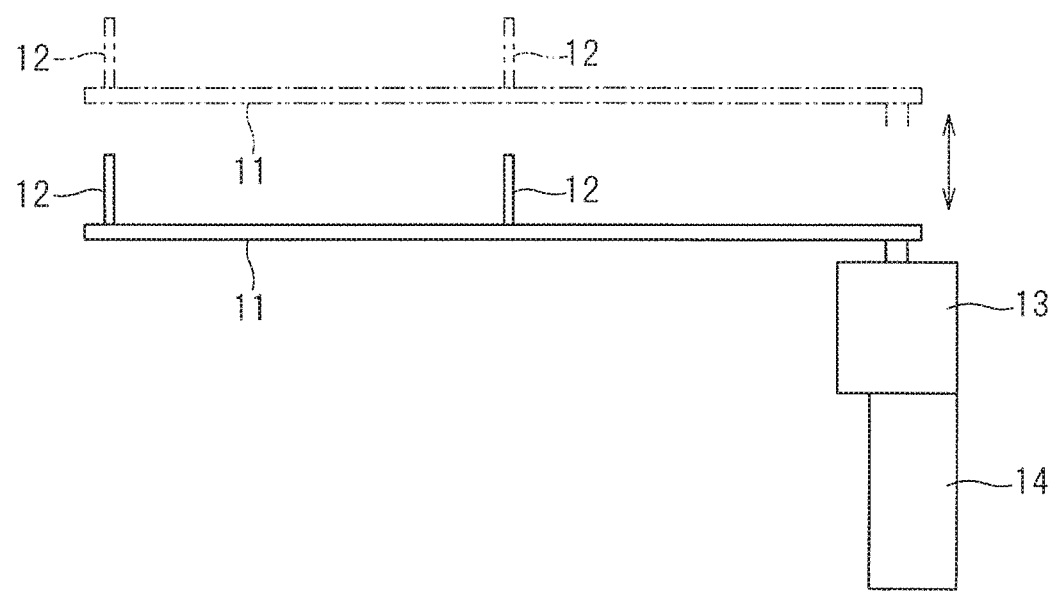
FIG. 6 is a side view of the transfer mechanism.

FIG. 5 is a plan view of the transfer mechanism 10. FIG. 6 is a side view of the transfer mechanism 10. The transfer mechanism 10 includes two transfer arms 11. The transfer arm 11 has an arc shape which is along approximately annular recessed part 62. The two lift pins 12 are provided to rise from each of the transfer arms 11. Each transfer arm 11 is pivotably moved by a horizontal movement mechanism 13. The horizontal movement mechanism 13 horizontally moves the pair of transfer arms 11 between a transfer operation position (solid-line position in FIG. 5) in which the substrate W is transferred to the retention unit 7 and a retreat position (two-dot chain line in FIG. 5) in which the transfer arm 11 does not overlap with the substrate W retained by the retention unit 7 in planar view. The horizontal movement mechanism 13 may turn the transfer arms 11 separately by respective motors or may turn the pair of transfer arms 11 in conjunction with each other by one motor using a link mechanism.

Furthermore, the pair of transfer arms 11 is vertically moved together with the horizontal movement mechanism 13 by an elevating mechanism 14. When the elevating mechanism 14 moves up the pair of transfer arms 11 in the transfer operation position, the four lift pins 12 pass through the through-holes 79 (refer to FIGS. 2 and 3) provided in the susceptor 74, and upper ends of the lift pins 12 project from the upper surface of the susceptor 74. Meanwhile, when the elevating mechanism 14 moves down the pair of transfer arms 11 in the transfer operation position, the lift pins 12 are pulled out of the through-holes 79, and then when the horizontal movement mechanism 13 moves the pair of transfer arms 11 outwardly, the transfer arms 11 are moved to the retreat position. The retreat position of the pair of transfer arms 11 is provided right above the base ring 71 of the retention unit 7. Since the base ring 71 is placed on the bottom surface of the recessed part 62, the retreat position of the transfer arms 11 is inside the recessed part 62. Also, in the vicinity of the part at which a drive unit (horizontal movement mechanism 13 and the elevating mechanism 14) of the transfer mechanism 10 is provided, an exhaust mechanism (not shown) is provided and is configured so as to discharge the atmosphere around the drive unit of the transfer mechanism 10 to outside of the chamber 6.

Referring to FIG. 1 again, the flash heating unit 5 provided above the chamber 6 includes the light source composed of a plurality of (30 in this preferred embodiment) xenon flash lamps FL, and a reflector 52 provided so as to cover the light source from above, in a housing 51. Furthermore, a lamp-light radiation window 53 is attached to a bottom portion of the housing 51 of the flash heating unit 5. The lamp-light radiation window 53 constituting a floor part of the flash heating unit 5 is a plate-shaped quartz window formed of quartz. Since the flash heating unit 5 is provided above the chamber 6, the lamp-light radiation window 53 faces the upper chamber window 63. The flash lamps FL emits the flash light from, above the chamber 6 toward the heat treatment space 65 through the lamp-light radiation window 53 and the upper chamber window 63.

Each of the plurality of flash lamps FL is a rod-shaped lamp having a longitudinal cylindrical shape, and they are planarly arranged so that their longitudinal directions become parallel to each other over a main surface of the substrate W retained by the retention unit 7 (that is, along the horizontal direction). Thus, a planar surface formed by the arranged flash lamps FL is also a horizontal surface.

Figure 8:
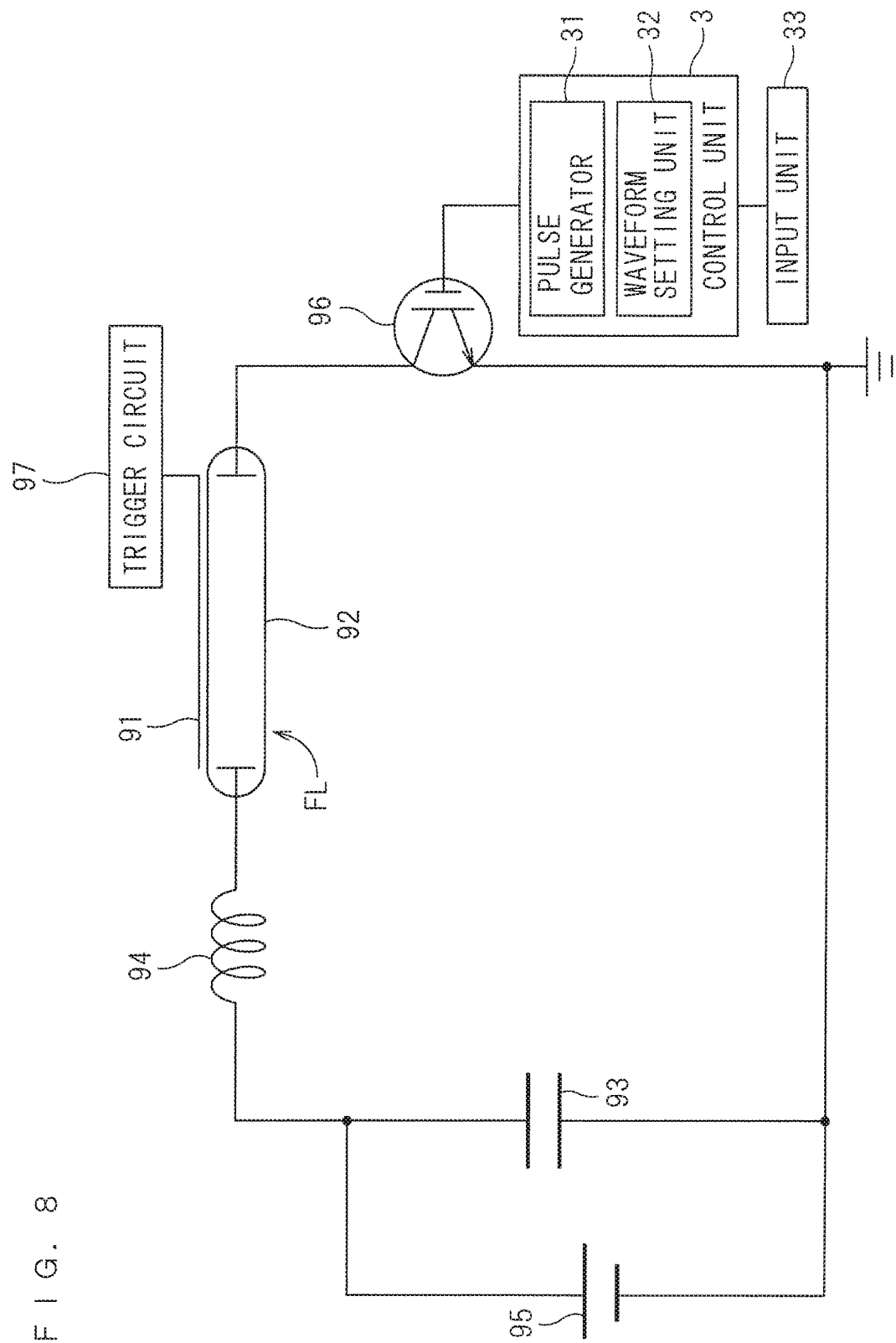
FIG. 8 is a view illustrating a drive circuit of a flash lamp.

FIG. 8 is a view illustrating a drive circuit of the flash lamp FL. As illustrated in FIG. 8, a capacitor 93, a coil 94, the flash lamps FL, and an insulated gate bipolar transistor (IGBT) 96 are connected in series. Furthermore, as illustrated in FIG. 8, the control unit 3 includes a pulse generator 31 and a waveform setting unit 32, and is connected to an input unit 33. The input unit 33 includes various well-known input devices such as keyboard, mouse, and touch panel. The waveform setting unit 32 sets a waveform of a pulse signal based on input contents from the input unit 33, and the pulse generator 31 generates a pulse signal based on the waveform.

The flash lamp FL includes a rod-shaped glass tube (discharge tube) 92 containing sealed xenon gas and having an anode and a cathode at its both ends, and a trigger electrode 91 provided above an outer circumferential surface of the glass tube 92. A predetermined voltage is applied to the capacitor 93 from an electric-power-source unit 95, and an electric charge corresponding to the applied voltage (charge voltage) is accumulated therein. In addition, a high voltage can be applied to the trigger electrode 91 from the trigger circuit 97. The timing for applying the voltage from the trigger circuit 97 to the trigger electrode 91 is controlled by the control unit 3.

The IGBT 96 is the bipolar transistor incorporating a metal oxide semiconductor field effect transistor (MOSFET) in a gate portion, and is a switching element suitable for handling large electric power. The pulse signal is applied to the gate of the IGBT 96 from the pulse generator 31 of the control unit 3. When a voltage (high voltage) having a predetermined value or higher is applied to the gate of the IGBT 96, the IGBT 96 becomes an on-state, and when a voltage (low voltage) having a value lower than the predetermined value is applied, the IGBT 96 becomes an off-state. In this way, the drive circuit including the flash lamp FL is turned on/off by the IGBT 96. When the IGBT 96 is turned on/off, the flash lamp FL is connected to and disconnected from the corresponding capacitor 93, and a current flowing to the flash lamp FL is subjected to on/off control.

Even when the IGBT 96 becomes the on-state and the high voltage is applied to the both electrodes of the glass tube 92 in the state that the capacitor 93 is charged, a current does not flow in the glass tube 92 in a normal state because the xenon gas is an electrical insulator. However, in a case where the high voltage is applied to the trigger electrode 91 from the trigger circuit 97 to cause insulation breakdown, a current instantaneously flows in the glass tube 92 due to the discharge between the both-end electrodes, and a light is emitted due to excitation of atoms or molecules of xenon.

The drive circuit illustrated in FIG. 8 is individually provided for each of the plurality of flash lamps FL provided in the flash heating unit 5. In this preferred embodiment, the 30 flash lamps FL are planarly arranged, and accordingly the 30 drive circuits illustrated in FIG. 8 are provided. Thus, the current flowing in each of the 30 flash lamps FL is subjected to individual on/off control by the corresponding IGBT 96.

Furthermore, the reflector 52 is provided above the plurality of flash lamps FL so as to cover all of them. The reflector 52 basically functions to reflect the flash light emitted from the flash lamps FL toward the heat treatment space 65. The reflector 52 is formed of an aluminum alloy plate, and its surface (surface facing the flash lamps FL) has been undergone surface roughening process by blast treatment.

The halogen heating unit 4 provided below the chamber 6 incorporates the plurality of (40 in this preferred embodiment) halogen lamps HL in a housing 41. The halogen heating unit 4 is a light irradiation unit which carries out light irradiation to the heat treatment space 65 from below the chamber 6 through the lower chamber window 64 by the plurality of halogen lamps HL and heats the substrate W.

FIG. 7 is a planar view illustrating the layout of the plurality of halogen lamps HL. The 40 halogen lamps HL are disposed separately in upper/lower two stages. Thus, the 20 halogen lamps HL are disposed in an upper stage closer to the retention unit 7, and the 20 halogen lamps HL are disposed in a lower stage farther from the retention unit 7 than the upper stage. Each halogen lamp HL is a rod-shaped lamp having a longitudinal cylindrical shape. The 20 halogen lamps HL in each of the upper stage and the lower stage are arranged so that their longitudinal directions become parallel to each other over the main surface of the substrate W retained by the retention unit 7 (that is, along the horizontal direction). Thus, a planar surface formed by the arranged halogen lamps HL in each of the upper and lower stages is a horizontal surface.

Furthermore, as illustrated in FIG. 7, a density of the disposed halogen lamps HL is higher in a region facing a peripheral portion of the substrate W retained by the retention unit 7 than in a region facing a center thereof in each of the upper and lower stages. That is, both in the upper and lower stages, a pitch of the disposed halogen lamps HL is shorter in the peripheral portion than in the center portion. Therefore, irradiation with larger amount of light can be performed for the peripheral portion of the substrate W in which temperature reduction easily occurs in a case of heating by the light irradiation from the halogen heating unit 4.

Furthermore, the lamp group composed of the halogen lamps HL in the upper stage and the lamp group composed of the halogen lamps HL in the lower stage are arranged to intersect with each other in the form of a lattice. That is, the 40 halogen lamps HL in total are arranged in such a manner that the longitudinal direction of the 20 halogen lamps HL arranged in the upper stage intersects with the longitudinal direction of the 20 halogen lamps HL arranged in the lower stage.

The halogen lamp HL is a filament-type light source in which light is emitted by allowing a filament to be incandescent by distributing electricity to the filament disposed in the glass tube, in the glass tube, a gas of an inert gas such as nitrogen or argon to which a minute amount of halogen element (such as iodine or bromine) is introduced is sealed. As a result of introducing the halogen element, the temperature of the filament can be set to a high temperature while inhibiting breaking of the filament Therefore, the halogen lamp HL has characteristics of having a long life and being able to continuously emit intense light compared with a normal incandescent lamp. That is, the halogen lamp HL is a continuously lighting lamp which emits light continuously for at least one second. Furthermore, since the halogen lamp HL is the rod-shaped lamp, it has long life, and when the halogen lamps HL are disposed along the horizontal direction, a radiation efficiency to the substrate W provided above can be excellent.

Also in the housing 41 of the halogen heating unit 4, a reflector 43 is also provided below the two-stage halogen lamps HL (refer to FIG. 1). The reflector 43 reflects the light emitted from the plurality of halogen lamps HL toward the heat treatment space 65.

The control unit 3 controls the above-described various operation mechanisms provided in the heat treatment apparatus 1. A configuration of the control unit 3 as a hardware is similar to that of a general computer. That is, the control unit 3 includes a CPU serving as a circuit for performing various arithmetic processing, a ROM serving as a read-only memory for storing a basic program, a RAM serving as a readable/writable memory for storing various information, and a magnetic disk for storing controlling software and data. The CPU of the control unit 3 carries out a predetermined processing program, so that the process proceeds in the heat treatment apparatus 1.

Other than the above-described configurations, the heat treatment apparatus 1 has various cooling structures to prevent the halogen heating unit 4, the flash heating unit 5, and the chamber 6 from being excessively increased in temperature due to thermal energy generated from the halogen lamp and flash lamp FL during the heat treatment for the substrate W. For example, a water-cooled tube (not shown) is provided in a wall of the chamber 6. Furthermore, each of the halogen heating unit 4 and the flash heating unit 5 has an air-cooling structure which forms a gas flow inside it to exhaust heat. Furthermore, air is supplied to a gap between the upper chamber window 63 and the lamp-light radiation window 53 to cool the flash heating unit 5 and the upper chamber window 63.

Next, a heat treatment method for the semiconductor in the present invention will be described. In this preferred embodiment, the heat treatment apparatus 1 performs an annealing process to activate a boron-doped germanium p-type semiconductor.

Figure 9:
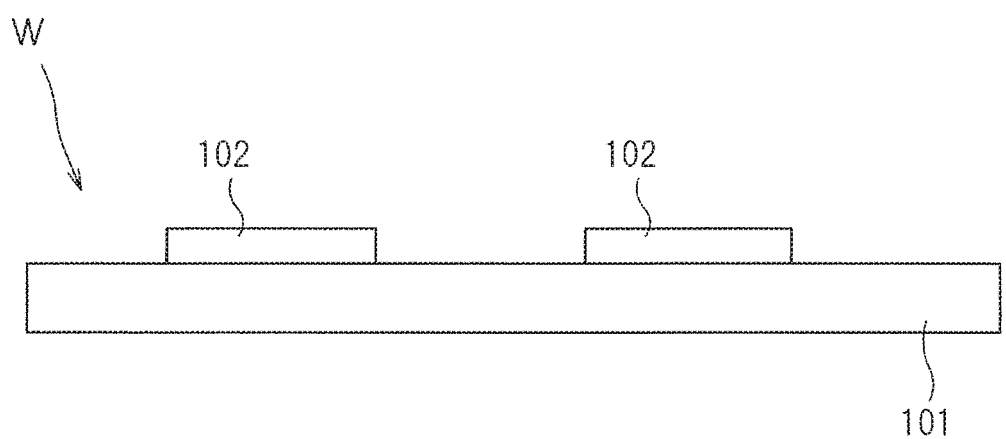
FIG. 9 is a view schematically illustrating a structure of a substrate to be treated in the heat treatment apparatus.

FIG. 9 is a view schematically illustrating a structure of the substrate W to be processed in the heat treatment apparatus 1. In this preferred embodiment, a germanium semiconductor layer 102 is formed in one region on an upper surface of a silicon base material 101. The semiconductor layer 102 is made of single-crystal germanium. The semiconductor layer 102 is extremely thin and its film thickness is several 10 nm.

Prior to the heat treatment according to the present invention, boron is doped as a dopant in a surface of the germanium semiconductor layer 102. The dopant is doped by an ion implantation device different from the heat treatment apparatus 1. Acceleration energy and a dose amount at the time of ion implantation can be appropriately set. When a minute amount of boron is doped, the semiconductor layer 102 becomes a p-type semiconductor containing germanium as a major component.

Here, boron which has been just doped by the ion implantation is inactive because it does not conform to the crystal of germanium, and a lattice defect is generated in the crystal of germanium due to the ion implantation, so that those need to be recovered. Thus, the flash lamp annealing is performed in the heat treatment apparatus 1 for the germanium semiconductor layer 102 in which the minute amount of boron is doped. The heat treatment apparatus 1 performs the heat treatment for the substrate W in which the semiconductor layer 102 is formed on the silicon base material 101. Hereinafter, the heat treatment for the substrate W in the heat treatment apparatus 1 will be described. The process procedure in the heat treatment apparatus 1 in the following description is performed while the control unit 3 controls each operation mechanism of the heat treatment apparatus 1.

First, the gate valve 185 is set to open the conveyance opening 66, and the substrate W is carried into the heat treatment space 65 in the chamber 6 by a carrier robot provided outside the apparatus through the conveyance opening 66. That is, the semiconductor layer 102 is carried into the chamber 6. The substrate W carried by the carrier robot is moved to the position just above the retention unit 7 and stops. Then, the pair of transfer arms 11 of the transfer mechanism 10 is horizontally moved from the retreat position to the transfer operation position and raised, and the lift pins 12 project from the upper surface of the retention plate 75 of the susceptor 74 through the through-holes 79 to receive the substrate W. Here, the lift pins 12 are raised to be higher than the upper ends of the substrate support pins 77.

After the substrate W is placed on the lift pins 12, the carrier robot exits from the heat treatment space 65, and the conveyance opening 66 is closed with the gate valve 185. After that, the pair of transfer arms 11 is lowered, and the substrate W is transferred from the transfer mechanism 10 to the susceptor 74 of the retention unit 7 and supported from below in the horizontal state. The substrate W is retained by the susceptor 74 while it is supported by the plurality of substrate support pins 77 provided on the retention plate 75 to rise therefrom. Furthermore, the substrate W is retained by the retention unit 7 with its front surface having the semiconductor layer 102 formed facing upward. A predetermined space is provided between the back surface of the substrate W supported by the plurality of substrate support pins 77 (the main surface opposite to the front surface) and the retention surface 75a of the retention plate 75. The pair of transfer arms 11 lowered below the susceptor 74 is moved to the retreat position by the horizontal movement mechanism 13, that is, it retreats into the recessed part 62.

Furthermore, after the conveyance opening 66 is closed with the gate valve 185 and the heat treatment space 65 becomes the sealed space, an atmosphere in the chamber 6 is adjusted. More specifically, the valve 84 is opened and the treatment gas is supplied from the gas supply hole 81 to the heat treatment space 65. In this preferred embodiment, nitrogen is supplied as the treatment gas to the heat treatment space 65 in the chamber 6. Furthermore, the valve 89 is opened and the gas in the chamber 6 is exhausted from the gas exhaust hole 86. Thus, the treatment gas supplied from the upper portion of the heat treatment space 65 in the chamber 6 flows downward and is exhausted from the lower portion of the heat treatment space 65, so that the atmosphere in the heat treatment space 65 is replaced with a nitrogen atmosphere. Furthermore, when the valve 192 is opened, the gas in the chamber 6 is exhausted through the conveyance opening 66. In addition, the atmosphere around the drive unit of the transfer mechanism 10 is also exhausted through an exhaust mechanism (not shown).

FIG. 10 is a view illustrating a temperature change of the semiconductor layer 102 formed on the surface of the substrate W. After the atmosphere in the chamber 6 is replaced with the nitrogen atmosphere, and the substrate W is retained by the susceptor 74 of the retention unit 7 from below in the horizontal state, the 40 halogen lamps HL are turned on at the same time in the halogen heating unit 4 at a time t1 to start preheating (assist heating). The halogen light emitted from the halogen lamp HL is applied to the back surface of the substrate W through the lower chamber window 64 and the susceptor 74 made of quartz. The substrate W is preheated by receiving the light irradiation from the halogen lamp HL and increased in temperature. Furthermore, since the transfer arms 11 of the transfer mechanism 10 are retreated in the recessed part 62, and therefore, do not hinder the preheating by the halogen lamp HL.

While the preheating is performed by the halogen lamp HL, the temperature of the substrate W is measured by the radiation thermometer 120. That is, the increasing temperature of the substrate is measured when the radiation thermometer 120 receives the infrared light emitted from the back surface of the substrate W retained by the susceptor 74 through the opening 78. The measured temperature of the substrate W is transmitted to the control unit 3. The control unit 3 monitors whether or not the temperature of the substrate W which rises due to the light irradiation from the halogen lamp HL reaches a preheating temperature T1, to control an output of the halogen lamp HL. That is, the control unit 3 performs feedback control on the output of the halogen lamp HL, based on the value measured by the radiation thermometer 120 so that the temperature of the substrate W can reach the preheating temperature T1. The preheating temperature T1 is set between 200° C. and 300° C. (200° C. in this preferred embodiment).

After the temperature of the substrate W has reached the preheating temperature T1, the control unit 3 keeps the substrate W at the preheating temperature T1 for a while. More specifically, when the temperature of the substrate W measured by the radiation thermometer 120 reaches the preheating temperature T1, the control unit 3 adjusts the output of the halogen lamp HL to keep the temperature of the substrate W at roughly the preheating temperature T1.

Thus, the preheating is performed by the halogen lamp HL, so that the substrate W is uniformly heated up to the preheating temperature T1 as a whole. Therefore, the semiconductor layer 102 is also heated at the preheating temperature T1. Here, while the preheating is performed by the halogen lamp HL, a temperature at the peripheral portion of the substrate W is likely to drop because heat is easily released compared with that in the center. However, in the halogen heating unit 4, the density of the arranged halogen lamps HL is higher in the region facing the peripheral portion than in the region facing the center portion of the substrate W. Therefore, the larger amount of light is applied to the peripheral portion of the substrate W in which the heat is easily released, so that a uniform in-plane temperature distribution can be provided in the substrate W during the preheating.

At the point of time t2 when predetermined time has passed after the temperature of the substrate W has reached the preheating temperature T1, the front surface of the substrate W is irradiated with the flash light from the flash lamp FL in the flash heating unit 5. Prior to the flash light irradiation by the flash lamp FL, the electric charge is previously accumulated in the capacitor 93 by the electric-power-source unit 95. In the state in which the electric charge is accumulated in the capacitor 93, the pulse signal is output from the pulse generator 31 of the control unit 3 to the IGBT 96 to turn the IGBT 96 on and off.

The waveform of the pulse signal can be defined by inputting a recipe which has been sequentially set using parameters of a pulse width time (on time and a pulse interval time (off time) from the input unit 33. When an operator inputs the above recipe from the input unit 33 to the control unit 3, the waveform setting unit 32 of the control unit 3 sets a pulse waveform which repeats on/off based on the recipe. Thus, based on the pulse waveform set by the waveform setting unit 32, the pulse generator 31 outputs the pulse signal. As a result, the pulse signal having the set waveform is applied to the gate of the IGBT 96, whereby the on/off drive of the IGBT 96 is controlled. More specifically, when the pulse signal input to the gate of the IGBT 96 is on, the IGBT 96 becomes an on-state, and when the pulse signal is off, the IGBT 96 becomes an off-state.

In synchronization with the timing at which the pulse signal output from the pulse generator 31 becomes on, the control unit 3 controls the trigger circuit 97 and applies a high voltage (trigger voltage) to the trigger electrode 91. In the state in which electric charge is accumulated in the capacitor 93, the pulse signal is input to the gate of the IGBT 96, and the high voltage is applied to the trigger electrode 91 in synchronization with the timing at which the pulse signal becomes on. Thus, when the pulse signal is on, a current surely flows between the electrodes at both ends of the glass tube 92, so that the light is emitted due to the excitation of atoms or molecules of xenon at that time.

Thus, the light is emitted from the 30 flash lamps FL in the flash heating unit 5, and the flash light is applied to the front surface of the substrate W retained by the retention unit 7. Here, in a case where the light is emitted from the flash lamps FL without using the IGBT 96, the electric charge accumulated in the capacitor 93 is consumed by one light emission, and the output waveform from the flash lamp FL becomes a simple single-pulse having a width of 0.1 milliseconds to 10 milliseconds. Meanwhile, in this preferred embodiment, the IGBT 96 serving as the switching element is connected in the circuit and the pulse signal is output to the gate of the JUST 96, so that the electric charge is intermittently supplied from the capacitor 93 to the flash lamp FL by the IGBT 96, and on/off control of the current which flows to the flash lamp FL is carried out. As a result, the light emission of the flash lamp FL is controlled by chopper control, so that the electric charge accumulated in the capacitor 93 is divided and consumed and the flash lamp FL repeats blinking in an extremely short period of time. In addition, before a value of current flowing in the circuit becomes completely "0", the next pulse is applied to the gate of the IGBT 96 to increase the value of current again, so that the light emission output does not become completely "0" even while the flash lamp FL is repeating blinking.

By subjecting the current flowing in the flash lamp FL to the on/off control by the IGBT 96, a light emission pattern of the flash lamp FL (time waveform of the light emission output) can be freely defined, so that the light emission time and light emission intensity can be freely adjusted. The pattern of the on/off drive of the IGBT 96 is defined by the pulse width time and the pulse interval time input from the input unit 33. That is, when the IC 96 is incorporated in the drive circuit of the flash lamp FL, the light emission pattern of the flash lamp FL can be freely defined only by appropriately setting the pulse width time and the pulse interval time input from the input unit 33.

More specifically, when a ratio of the pulse width time is increased with respect to the pulse interval time input from the input unit 33, the current flowing in the flash lamp FL is increased and the light emission intensity becomes strong. Meanwhile, when the ratio of the pulse width time is reduced with respect to the pulse interval time input from the input unit 33, the current flowing in the flash lamp FL is reduced and the light emission intensity becomes weak. In addition, by appropriately adjusting the ratio of the pulse interval time and the pulse width time input from the input unit 33, the light emission intensity of the flash lamp FL can be maintained constant. Still furthermore, by increasing a total time of the combination of the pulse width time and the pulse interval time input from the input unit 33, the current keeps flowing to the flash lamp FL for a relatively long period of time, so that the light emission time of the flash lamp FL is increased. In this preferred embodiment, the light emission time of the flash lamp FL is set between 0.1 milliseconds to 100 milliseconds.

In this way, the substrate W is heated with its front surface irradiated with the flash light from the flash lamp FL for the irradiation time of 0.1 milliseconds to 100 milliseconds. Since the intense flash light is applied for the extremely short irradiation time of 0.1 milliseconds to 100 milliseconds, the front surface of the substrate W including the germanium semiconductor layer 102 can be instantaneously heated up to a treatment temperature T2. The treatment temperature T2 which is a maximum temperature (peak temperature) of the front surface of the substrate W reached by the flash light irradiation ranges from 500° C. to 900° C., and in this preferred embodiment, it is 700° C. In the flash heating, since the irradiation time of the flash light is as extremely short as 100 milliseconds or less, the front surface temperature of the substrate W reaches the treatment temperature T2 instantaneously and then drops close to the preheating temperature T1.

When the front surface of the substrate W is irradiated with the flash light, the germanium semiconductor layer 102 is also heated up to the treatment temperature T2. When the semiconductor layer 102 having boron serving as dopant doped in surface is instantaneously heated up to the treatment temperature T2, the dopant is activated. Furthermore, the lattice defect generated in the crystal of germanium due to the ion implantation is recovered.

After a predetermined time has passed after the flash heating treatment is finished, the halogen lamps HL, are turned off. Thus, the temperature of the substrate W rapidly drops from the preheating temperature T1. The dropping temperature of the substrate W is measured by the radiation thermometer 120, and its measurement result is transmitted to the control unit 3. The control unit 3 monitors whether or not the temperature of the substrate W drops to a predetermined temperature, based on the measurement result of the radiation thermometer 120. Thus, when the temperature of the substrate W drops to the predetermined temperature or lower, the pair of transfer arms 11 of the transfer mechanism 10 is horizontally moved again from the retreat position to the transfer operation position and raised, as a result, the lift pins 12 project from the upper surface of the susceptor 74 and receive the heat-treated substrate W from the susceptor 74. After that, the conveyance opening 66 closed with the gate valve 185 is opened, and the substrate W placed on the lift pins 12 is carried out by the carrier robot provided outside the apparatus, whereby the heat treatment for the substrate W by the heat treatment apparatus 1 is completed.

In this preferred embodiment, the germanium semiconductor layer 102 doped with the dopant such as boron is preheated at the preheating temperature T1 ranging from 200° C. to 300° C., and then the semiconductor layer 102 is heated at the treatment temperature T2 ranging from 500° C. to 900° C. in an extremely short period of time by irradiation of the flash light from the flash lamp FL.

As described above, oxygen is unavoidably mixed in germanium, so that when that germanium is heated to 300° C. to 500° C., the mixed oxygen emits the free electron and becomes the thermal donor. In the case of p-type semiconductor, the problem is that the free electron emitted from the thermal donor is combined with the hole serving as the earlier and the hole disappears.

In this preferred embodiment, the semiconductor layer 102 of the germanium p-type semiconductor is preheated at the preheating temperature T1 ranging from 200° C. to 300° C., and then the semiconductor layer 102 is heated at the treatment temperature T2 ranging from 500° C. to 900° C. by an extremely short-time irradiation of the flash light. Thus, the semiconductor layer 102 passes through a temperature range of 300° C. to 500° C. instantaneously at the time of flash light irradiation, but the irradiation time of the flash light is as extremely short as 0.1 milliseconds to 100 milliseconds, so that the semiconductor layer 102 stays in the temperature range of 300° C. to 500° C. for the negligibly short period of time. Therefore, the oxygen existing in the germanium semiconductor layer 102 is prevented from becoming the thermal donor and emitting the free electron. As a result, the hole in the semiconductor layer 102 can be prevented from disappearing due to the recombination, so that the p-type semiconductor can maintain its function.

The preferred embodiment of the present invention has been described in above, but the present invention can be variously modified other than the above-described ones, without departing from the scope of the present invention. In the above preferred embodiment, boron is doped in the germanium semiconductor layer 102 as the dopant, but the present invention is not limited to this, and a trivalent dopant such as indium (In) may be doped. That is, the dopant only needs to form the p-type semiconductor when added to germanium.

Furthermore, in the above preferred embodiment, the substrate W is subjected to the heat treatment in the chamber 6 under normal pressure, but the preheating and the flash heating may be performed in the chamber 6 under reduced pressure. More specifically, the preheating and the flash heating for the substrate W may be performed in the chamber 6 under pressure from 20 Pa to atmospheric pressure (about 101325 Pa).

Furthermore, in the above preferred embodiment, the germanium semiconductor layer 102 is formed in the region of the upper surface of the silicon base material 101, but a semiconductor wafer made of single-crystal germanium may be used as the substrate.

Furthermore, in the above preferred embodiment, 30 flash lamps FL are provided in the flash heating unit 5, but the present invention is not limited to this, and the number of the flash lamps FL may be any number. Furthermore, the flash lamp FL is not limited to the xenon lamp, and it may be a krypton flash lamp. Furthermore, the number of the halogen lamp HL provided in the halogen heating unit 4 is not limited to 40 and it may be any number.

In addition, in the above preferred embodiment, the substrate W is preheated by irradiation with the halogen light from the halogen lamp HL, but the present invention is not limited to this preheating method, and the substrate W may be preheated by being placed on a hot plate.

While the invention has been shown and described in detail, the foregoing description is in all aspects illustrative and not restrictive. It is therefore understood that numerous modifications and variations can be devised without departing from the scope of the invention.

What is claimed is:

1. A heat treatment method for a p-type semiconductor containing germanium as a major component comprising the steps of, the method comprising:
   (a) preheating a single crystal germanium semiconductor layer doped with a dopant at a preheating temperature ranging from 200° C. to 300° C.; and
   (b) heating said semiconductor layer at a treatment temperature ranging from 500° C. to 900° C. by irradiation with a flash light from a flash lamp for an irradiation time of 0.1 milliseconds to 100 milliseconds to activate said dopant without generating a thermal donor.

* * * * *